(12) United States Patent
Deng

(10) Patent No.: US 10,871,973 B2
(45) Date of Patent: Dec. 22, 2020

(54) APPLICATION ACTIVATION METHOD AND APPARATUS

(71) Applicant: TENCENT TECHNOLOGY (SHENZHEN) COMPANY LIMITED, Shenzhen (CN)

(72) Inventor: Linyuan Deng, Shenzhen (CN)

(73) Assignee: TENCENT TECHNOLOGY (SHENZHEN) COMPANY LIMITED, Shenzhen (CN)

(*) Notice: Subject to any disclaimer, the term of this patent is extended or adjusted under 35 U.S.C. 154(b) by 55 days.

(21) Appl. No.: 16/046,540

(22) Filed: Jul. 26, 2018

(65) Prior Publication Data

US 2018/0373544 A1    Dec. 27, 2018

Related U.S. Application Data

(63) Continuation of application No. PCT/CN2017/083446, filed on May 8, 2017.

(30) Foreign Application Priority Data

May 9, 2016   (CN) .......................... 2016 1 0300439

(51) Int. Cl.
*G06F 9/44*         (2018.01)
*G06F 9/445*        (2018.01)
(Continued)

(52) U.S. Cl.
CPC ............... *G06F 9/445* (2013.01); *G06F 8/41* (2013.01); *G06F 8/61* (2013.01); *G06F 16/16* (2019.01);
(Continued)

(58) Field of Classification Search
CPC ... G06F 9/445; G06F 8/41; G06F 8/61; G06F 16/16; H03M 7/30; H03M 7/50; H03M 7/702
See application file for complete search history.

(56) References Cited

U.S. PATENT DOCUMENTS

2006/0225038 A1*  10/2006  Okabe ................. G06F 9/44505
                                                  717/120
2013/0111564 A1*   5/2013  Jin ....................... H04N 1/4413
                                                    726/4

FOREIGN PATENT DOCUMENTS

CN    102231117 A    11/2011
CN    102830996 A    12/2012
(Continued)

OTHER PUBLICATIONS

Translated document of CN 105278989 (IDS filed on Jul. 26, 2018).*
(Continued)

*Primary Examiner* — Hanh Thi-Minh Bui
(74) *Attorney, Agent, or Firm* — Anova Law Group, PLLC

(57) ABSTRACT

An application activation method is provided. The method includes obtaining a first compressed file, where the first compressed file contains activation information of an application and compressed content of a code package of the application. The method also includes extracting the compressed content from the first compressed file; generating a second compressed file by using the compressed content without decompressing the compressed content; and loading the second compressed file, and activating the application according to the activation information in the first compressed file.

16 Claims, 8 Drawing Sheets

(51) Int. Cl.
  *H03M 7/30* (2006.01)
  *H03M 7/50* (2006.01)
  *G06F 16/16* (2019.01)
  *G06F 8/41* (2018.01)
  *G06F 8/61* (2018.01)

(52) U.S. Cl.
  CPC .............. *H03M 7/30* (2013.01); *H03M 7/50* (2013.01); *H03M 7/702* (2013.01)

(56) References Cited

FOREIGN PATENT DOCUMENTS

| | | | |
|---|---|---|---|
| CN | 103257868 | A | 8/2013 |
| CN | 103366386 | A | 10/2013 |
| CN | 104375869 | A | 2/2015 |
| CN | 104536787 | A | 4/2015 |
| CN | 104636665 | A | 5/2015 |
| CN | 105278989 | A | 1/2016 |
| CN | 105975311 | A | 9/2016 |

OTHER PUBLICATIONS

Zhongqing Jiang et al., CrackDex: Universal and automatic DEX extraction method, IEEE, 2017, retrieved online on Jun. 30, 2020, pp. 53-60. Retrieved from the Internet: <URL: https://ieeexplore.ieee.org/document/8076511?source=IQplus>. (Year: 2017).*

The World Intellectual Property Organization (WIPO) International Search Report for PCT/CN2017/083446 dated Jul. 28, 2017 6 Pages (including translation).

The State Intellectual Property Office of the People's Republic of China (SIPO) Office Action 2 for 201610300439.5 dated Jun. 28, 2020 15 Pages (including translation).

Deng_1957, "Android utilizes system broadcasting—listening to application installation and uninstallation," Sina BLOG, Feb. 21, 2012, Retrieved from the Internet URL: http://blog.sina.com.cn/s/blog_9935b66001012ddg.html, [retrieved on Jun. 17, 2020], p. 1-2. total 6 pages.

BloodyAngel, "Performance optimization summary (4): pre-loaded design," Blog Park, Jun. 30, 2010, Retrieved from the Internet URL: https://www.cnblogs.com/zgynhqf/archive/2010/06/30/1768604.html, [retrieved on Jun. 17, 2020], p. 1-3. Total 9 Pages.

* cited by examiner

| Mobile phone and android versions | Existing solution | Optimized |
|---|---|---|
| P1(android 4.4.2) | 3100ms | 170ms |
| P2(android 4.4.4) | 1400ms | 170ms | under # APPLICATION ACTIVATION METHOD AND APPARATUS

RELATED APPLICATION

This application is a continuation application of PCT Patent Application No. PCT/CN2017/083446, filed on May 8, 2017, which claims priority to Chinese Patent Application No. 2016103004395, entitled "APPLICATION ACTIVATION METHOD AND APPARATUS" filed with the Chinese Patent Office on May 9, 2016, content of all of which is incorporated herein by reference in its entirety.

FIELD OF THE TECHNOLOGY

This application relates to the field of communications technologies and, in particular, to an application activation method and apparatus.

BACKGROUND OF THE DISCLOSURE

An Android system limits that each dex (a code package) can only include 65535 method counts at most. During development, a compiling tool compiles program code into several dex packages whose method counts do not exceed 65535 according to this rule. All dexes may be sequentially loaded when an application is activated for the first time after the application is installed. When the application is activated for the first time, a specific method for loading the dex is shown in FIG. 1: a user clicks an icon, the dex is loaded for the application, compressed dex content is found from an Android package (APK) file, the compressed dex content is decompressed to a temporary directory, the decompressed dex content is recompressed as a zip file, all dex methods are loaded in a form of zip file, and a main interface of the application is entered.

In view of the above, when the installed application is activated for the first time, executions of decompression and recompression require much more time. Longer time is consumed if the number of the dexes is larger, and longer time is consumed if a device is a lower-end device. Such operations occur prior to activation of an interface and displaying of the main interface, and the user can clearly perceive that there is long wait between clicking an application icon and seeing the change of interface, resulting in poor user experience.

The disclosed methods and systems are directed to solve one or more problems set forth above and other problems.

SUMMARY

Embodiments of this application provide an application activation method and apparatus that may save time for decompression and recompression, reduce time for activating an application, and improve user experience.

According to one aspect of the present disclosure, an application activation method is provided. The method includes obtaining a first compressed file, where the first compressed file contains activation information of an application and compressed content of a code package of the application. The method also includes extracting the compressed content from the first compressed file; generating a second compressed file by using the compressed content without decompressing the compressed content; and loading the second compressed file, and activating the application according to the activation information in the first compressed file.

According to another aspect of the present disclosure, a non-transitory computer-readable storage medium is provided. The computer-readable medium stores computer program instructions executable by at least one processor to perform: obtaining a first compressed file. The first compressed file contains activation information of an application and compressed content of a code package of the application. The computer program instructions also cause the at least one processor to perform: extracting the compressed content from the first compressed file; generating a second compressed file by using the compressed content without decompressing the compressed content; and loading the second compressed file, and activating the application according to the activation information in the first compressed file.

According to another aspect of the present disclosure, an application activation apparatus is provided. The apparatus includes a memory and a processor coupled to the memory. The processor is configured to perform: obtaining a first compressed file. The first compressed file contains activation information of an application and compressed content of a code package of the application. The processor is also configured to perform: extracting the compressed content from the first compressed file; generating a second compressed file by using the compressed content without decompressing the compressed content; and loading the second compressed file, and activating the application according to the activation information in the first compressed file.

Other aspects of the present disclosure can be understood by those skilled in the art in light of the description, the claims, and the drawings of the present disclosure.

BRIEF DESCRIPTION OF THE DRAWINGS

To describe the technical solutions in the embodiments of the present disclosure more clearly, the following briefly describes the accompanying drawings. Apparently, the accompanying drawings in the following description show merely some embodiments of the present disclosure, and a person of ordinary skill in the art may derive other drawings from these accompanying drawings without creative efforts.

DESCRIPTION OF EMBODIMENTS

The following describes the technical solutions in the embodiments of the present disclosure with reference to the accompanying drawings. Apparently, the described embodiments are merely some but not all of the embodiments of the present disclosure. Other embodiments obtained by a person of ordinary skill in the art based on the embodiments of the present disclosure without creative efforts shall fall within the protection scope of the present disclosure.

Embodiments of the present disclosure provide an application activation method and apparatus. An application (also referred to as a target application) is any application installed on a terminal, including, but is not limited to, a browser application, an email application, an instant message service application, text processing, virtual keyboard, a window widget, encryption, digital copyright management, voice recognition, voice copy, positioning and navigation (for example, a function provided by a global positioning system), music playing, video playing, and the like.

The application activation method provided in the embodiments of the present disclosure is described below in detail with reference to FIG. 2 to FIG. 8.

Figure 1:
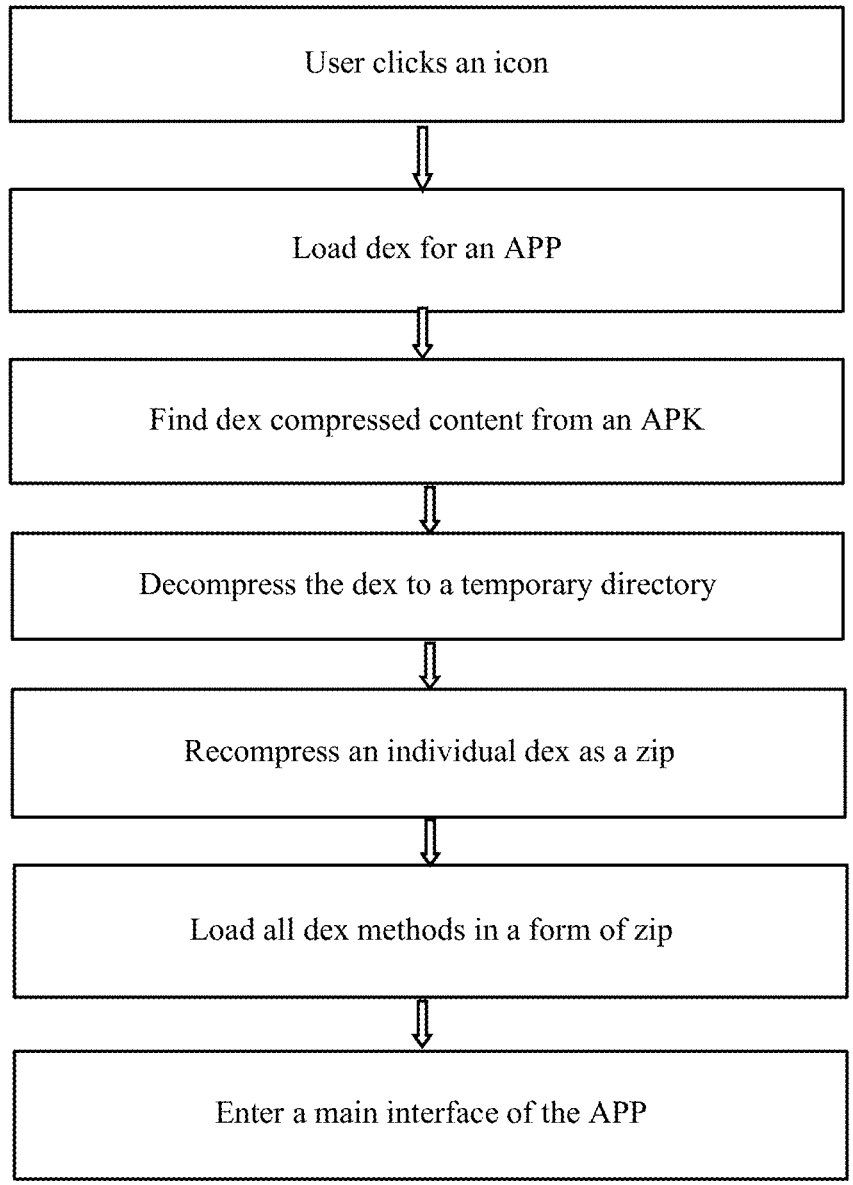
FIG. 1 is a flowchart of activating an application.
Figure 2:
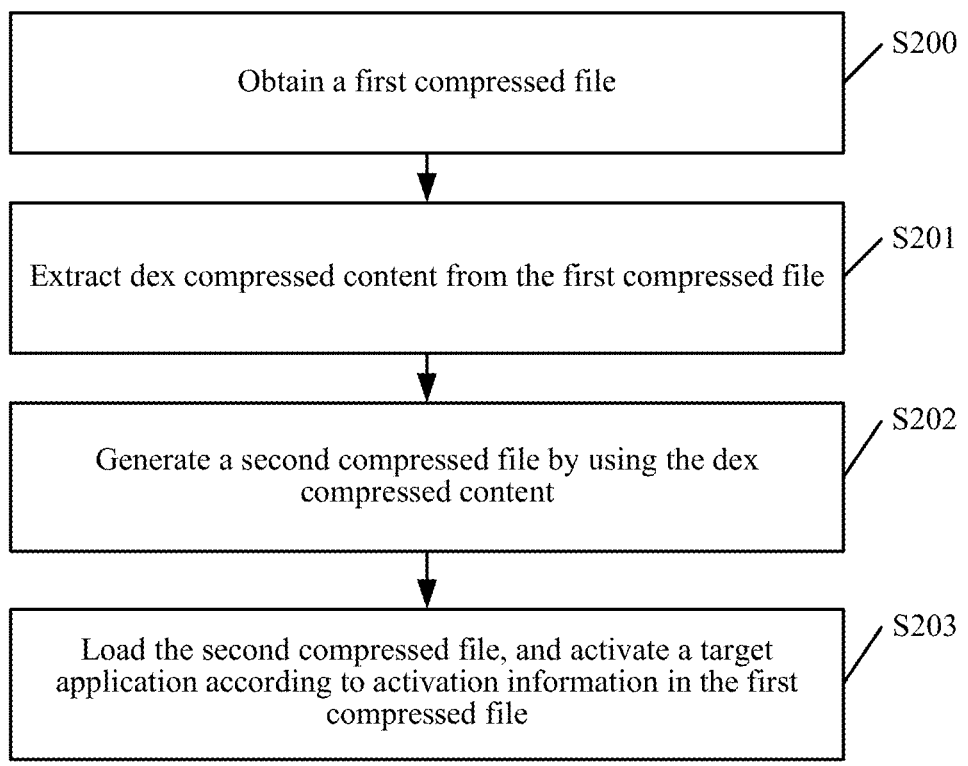
FIG. 2 is a flowchart of an application activation method according to an embodiment of the present disclosure.

FIG. 2 is a flowchart of the application activation method according to an embodiment of the present disclosure. Referring to FIG. 2, the method may include the followings.

S200: Obtaining a first compressed file, the first compressed file including activation information of a target application and compressed content of a code package (also referred to as compressed dex content) of the target application.

In one embodiment, after the target application is installed, and when the target application is activated for the first time, a dexopt operation needs to be performed on the code package (i.e., a dex) to extract the dex from an APK file for loading.

Optionally, the first compressed file may be an installation package file, for example, an Android package (APK) file. The APK file includes compressed dex content of the code package of the target application. The dex needs to be loaded during activation of the target application, and the dex is usually loaded in a form of zip file.

Further, optionally, the first compressed file includes the activation information of the target application. The activation information of the target application includes data for activating the target application and entry program code for activating the target application.

S201: Extracting the compressed dex content from the first compressed file.

In one embodiment, the compressed dex content is extracted from the first compressed file. A specific extraction process may be searching according to a file name of the compressed dex content. In an optional example, in an entry having a file name of classes2.dex in the APK file, the compressed dex content is found by traversing all entries, and details are shown in the following.

(1) An end-of-directory indication structure (the identifier is 0x06054b50) is first searched in the APK file and, at a position shifting downward for 16 bytes from the end-of-directory indication structure, the offset (the identifier is 0x02014b50) of a first entry of a core directory can be found.

(2) Subsequently, using a "for" loop to record information of each entry (offset of each entry in the APK file may be recorded, so as to position at the start point of the entry when the information is being written (that is, generating the second compressed file)), and file header information of the entry is found at a position 42-byte downward from the entry header. The file header information includes a file header and metadata (compressed data) of the file. Optionally, the file header information may further include hasDD. In the APK file, the compressed dex content is in the entry having the file name of classes2.dex. A write process of a zip compressed file may begin after the compressed dex content is found (for example, the zip compressed file may be manually written).

S202: Generating a second compressed file by using the compressed dex content.

In one embodiment, the second compressed file is generated according to the extracted compressed dex content. A compression format of the second compressed file may be different from that of the first compressed file. For example, the compression format of the second compressed file may be a zip format. Here, the compressed dex content does not need to be first decompressed to a temporary directory and then be recompressed, thereby saving time for activating the target application.

Optionally, generating the compressed dex content as the second compressed file may include the following two steps.

Step I: Generating header information of the second compressed file according to file header information of the compressed dex content in the first compressed file.

Step II: Generating core directory information of the second compressed file according to core directory information of the compressed dex content in the first compressed file.

In one embodiment, the second compressed file includes header information, core directory information, and information of the end-of-directory indication structure. The header information of the second compressed file is generated according to the file header information corresponding to the compressed dex content in the first compressed file during generation of the second compressed file. The header information of the second compressed file may include a file header and metadata (compressed data) of the file. Optionally, the header information of the second compressed file may further include hasDD.

Further, during generation of the second compressed file, the core directory information in the second compressed file may alternatively be generated according to the core directory information of the compressed dex content in the first compressed file.

Generating the second compressed file by using the compressed content may include copying the compressed content, and writing zip header information into the copied compressed content.

Specifically, the process of generating the second compressed file includes the following steps after (1) and (2) in step S201:

(3) First, writing file header information of the second compressed file, where the file name needs to be changed as classes.dex, the file name length is again calculated, and other information can be copied from the file header information of the entry in the APK file classes2.dex.

(4) Subsequently writing core directory information of the entry of the second compressed file.

Because there is only one entry, the file name, file name length, and file header displacement of the entry can be correspondingly modified quickly, and other information can be directly copied from information in the entry in the original APK file classes2.dex. In the foregoing step (2), the offset position of the entry in the APK file is recorded during reading of the APK file. Thus, a buffer stream may be used when searching the classes2.dex. Because the number of information bytes of each field in the entry is determined, the offset status of all positions may be positioned and recorded by using one variable.

(5) Writing the information of the end-of-directory indication structure of the second compressed file. Thus, the second compressed file can be completed without first decompressing the entire APK file and then compressing the decompressed content again.

S203: Loading the second compressed file, and activating the target application according to the activation information in the first compressed file.

In one embodiment, the compressed dex content in the second compressed file may be loaded, and the target application is activated according to the activation information in the first compressed file after the second compressed file is generated according to the compressed dex content. It should be noted that the activation information in the first compressed file may be in a decompressed state, for example, may be decompressed while being compiled during a process of installing the target application.

Accordingly, the dex decompression speed may be optimized according to steps S200 to S203. Reference may be made to the flowchart in FIG. 4 to understand how the dex decompression speed is optimized in the present disclosure. A dexopt operation needs to be performed on the dex when the installed target application is activated for the first time, and the dex needs to be extracted from the APK file. In this solution, the APK file is directly read; compressed dex content in a compressed state is found in the APK file; the corresponding content is copied and is directly outputted as a new zip file by means of adding a zip file header;

all methods of the dex are loaded in the form of zip file; and finally, the main interface of an application (APP) is entered. The decompression operation and then the compression operation are saved as compared with conventional solutions. If the target application is activated by using a dual core mobile phone of 1 GHz, this operation time of the file may be reduced from seconds to milliseconds.

Optionally, the compressed dex content is a sub-dex package (also referred to as a code sub-package) in the first compressed file; the sub-dex package includes a non-activation entry program; the activation information includes a main dex package (also referred to as a code main-package) in the first compressed file; and the main dex package includes at least one activation entry program in the decompressed state.

The loading the second compressed file, and activating the target application according to the activation information in the first compressed file includes the following steps S20 to S22:

S20: Activating the main dex package, and displaying an activation interface;

S21: Loading the second compressed file; and

S22: Executing the at least one activation entry program in the main dex package, and displaying a main interface of the target application when it is detected that the second compressed file is completely loaded.

In the conventional technology, when the target application is installed and activated for the first time, if the user clicks an application icon to activate the target application, the dex is first loaded and, after the loading of the dex is completed, the activation entry program of the target application is invoked to activate the target application, at which point a screen change or screen flicker finally occurs. That is, by activating the target application in this way, the user cannot see the screen change during a process of loading the dex, appearing in a frame freezing state occurs and resulting in poor user experience.

Figure 6:
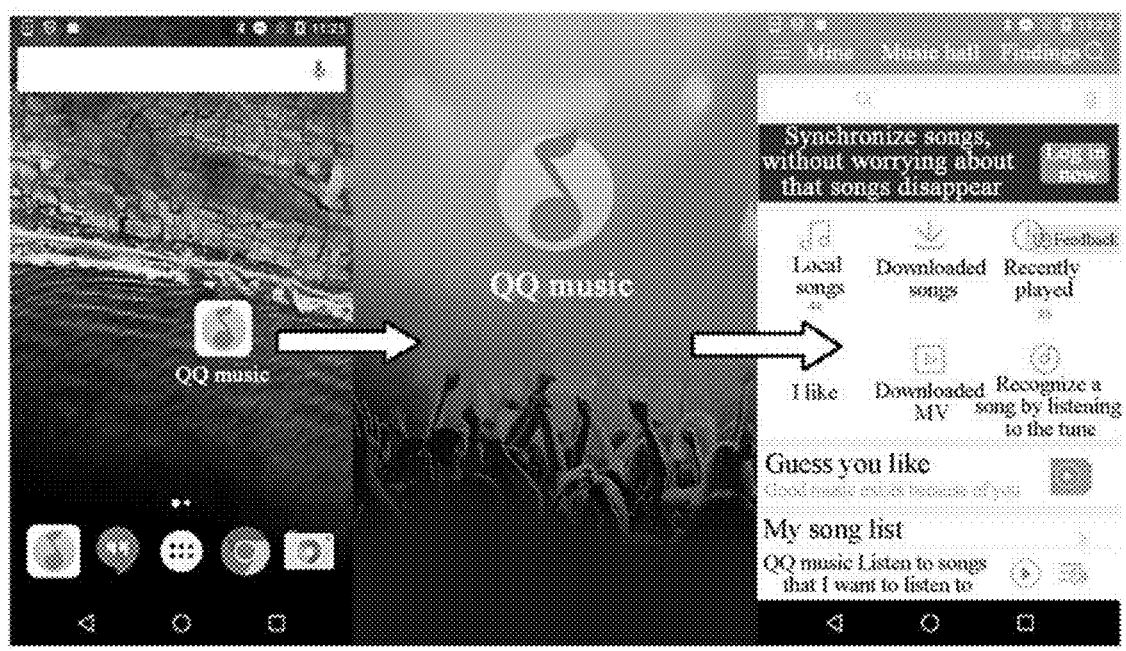
FIG. 6 is a schematic diagram of a product interface according to an embodiment of the present disclosure.

In one embodiment, the foregoing activation process is also improved, such that the screen change occurs first and then the dex is loaded. However, to implement the foregoing activation process, all direct dependency sets and indirect dependency sets of all possible activation entry programs need to be allocated in the main dex package during the installation and the compiling. In this way, the activation interface may be invoked during activation of the main dex package, that is, the screen change occurs. As shown in FIG. 6, when the user clicks the application icon, a second activation interface occurs, and the dexes are asynchronously loaded during a process of displaying the activation interface.

It should be noted that the dependency sets in the main dex package are very large, and an automatic sub-package solution of a system cannot ensure that the dependency sets of all activation entry programs are in the main dex package. Therefore, all direct dependency sets and indirect dependency sets of the activation entry programs may be analyzed, and then the dependency sets are ensured to be in the main dex package. In this way, successful activation is ensured. A script of the sub-dex package may be modified. A preset classification rule is added, and all programs are allocated in the main dex package and the sub-dex package according to the preset classification rule during the process of installing and compiling the target application.

A smallest dependency set needs to be kept in the main dex package, so as to ensure that the main dex package can have all dependency sets of us, mainly including the following parts: service, content provider, broadcast, MusicApplication, LifeCycleManager, BaseActivity, OuterShellBaseActivity, and DexActivity.

Figures 7, 8:
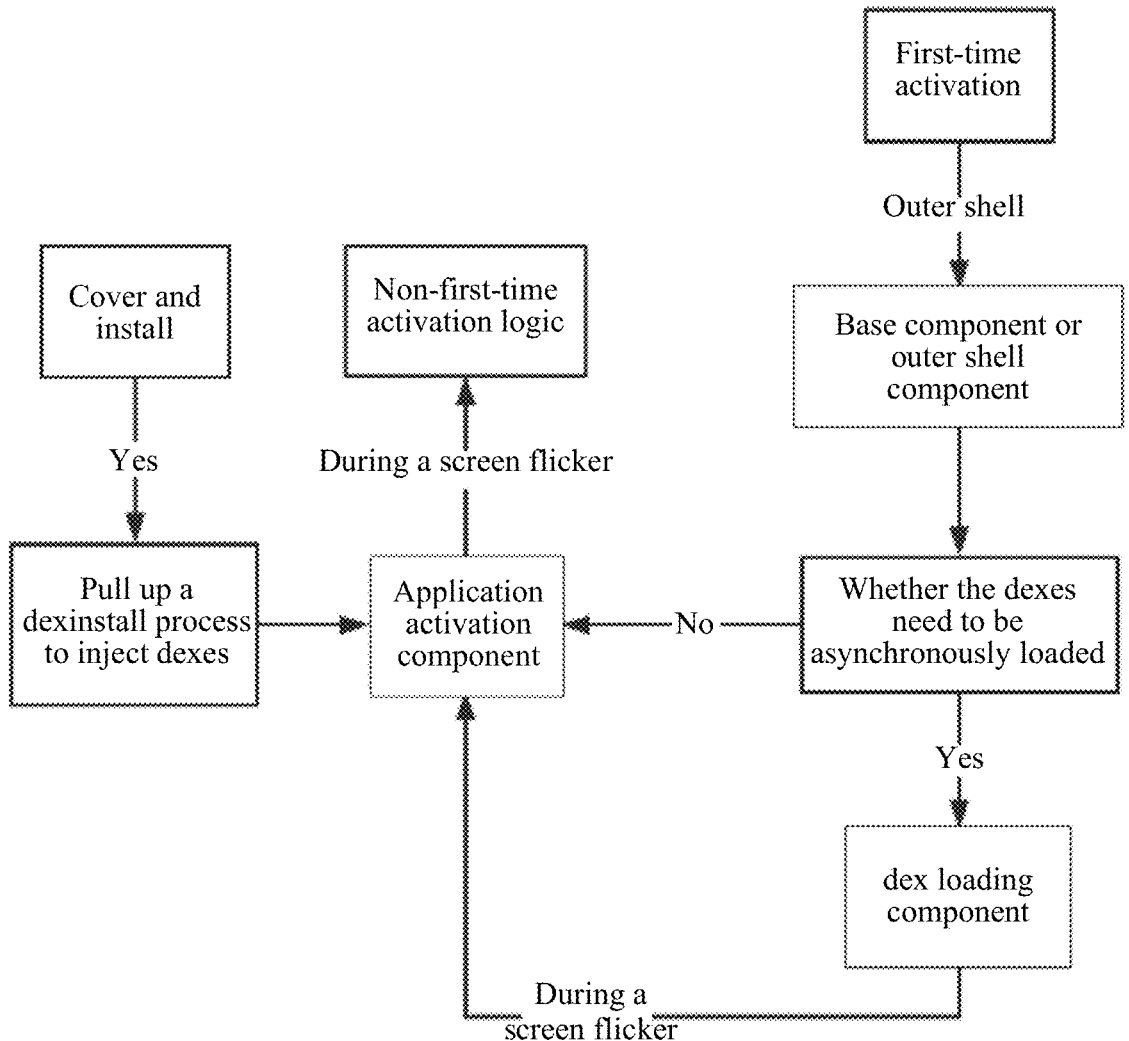
FIG. 7 is a schematic diagram of an optimization comparison according to an embodiment of the present disclosure.
FIG. 8 is a block diagram of activating an application according to an embodiment of the present disclosure.

Preferably, outer shell activities (the OuterShellBaseActivity and the DexActivity) are added to the main dex package. The OuterShellBaseActivity is in a base type, similar to the Activity. When the target application is activated for the first time, if the compressed dex content in the sub-dex package is not loaded, the activation interface may be invoked and displayed by using the outer shell. The flow is shown in FIG. 8:

A. A corresponding activity is activated by using a normal entry, and whether the dex is loaded is first determined in a base component Activity or an outer shell component OuterShellBaseActivity.

If yes->the activity is normally activated, and step B is performed; and

If not->current intent information is kept and is saved in a next intent, and then the DexActivity is activated. An original activity is activated according to the obtained intent after the dex is loaded in the DexActivity. The screen changing state is maintained during the process of asynchronously loading the dex. When the dex is completely loaded, the application is activated by invoking an application activation component, and a main interface of the application occurs. This activation manner is the first-time activation logic.

B. The dex is loaded in onattachbasecontext, and then the application is activated by invoking the application activation component, where a screen change occurs. This activation manner is non-first-time activation logic.

Further, as shown in FIG. 8, the activation manner may be an activation manner of covering and installing. Details are described in the embodiment of FIG. 3, which are not described herein again.

As shown in the table of FIG. 7, activating the target application consumes different amount of time by using different solutions. For example, if the target application is activated by using a dual core P1 mobile phone of 1 GHz of android 4.4.2, 3100 ms is consumed when the target application is activated by using a conventional solution, while 170 ms is consumed after being optimized by using the present disclosure. If the target application is activated by using a dual core P2 mobile phone of 1 GHz of android 4.4.4, 1400 ms is consumed when the target application is activated by using the conventional solution, while 170 ms is consumed after being optimized by using the present disclosure. It may be learned from the above comparison that the amount of time for activating the target application for the first time may be significantly reduced by using the disclosed application activation methods.

Accordingly, in the embodiments of the present disclosure, the first compressed file is obtained, the first compressed file including the activation information of the target application and the compressed dex content of the target application; the compressed dex content is extracted from the first compressed file; the second compressed file is generated by using the compressed dex content; the compressed dex content in the second compressed file is loaded; and the target application is activated according to the activation information in the first compressed file. This approach can save time for decompressing and recompressing a dex package, reduce time for activating the target application, and improve user experience.

Figure 3:
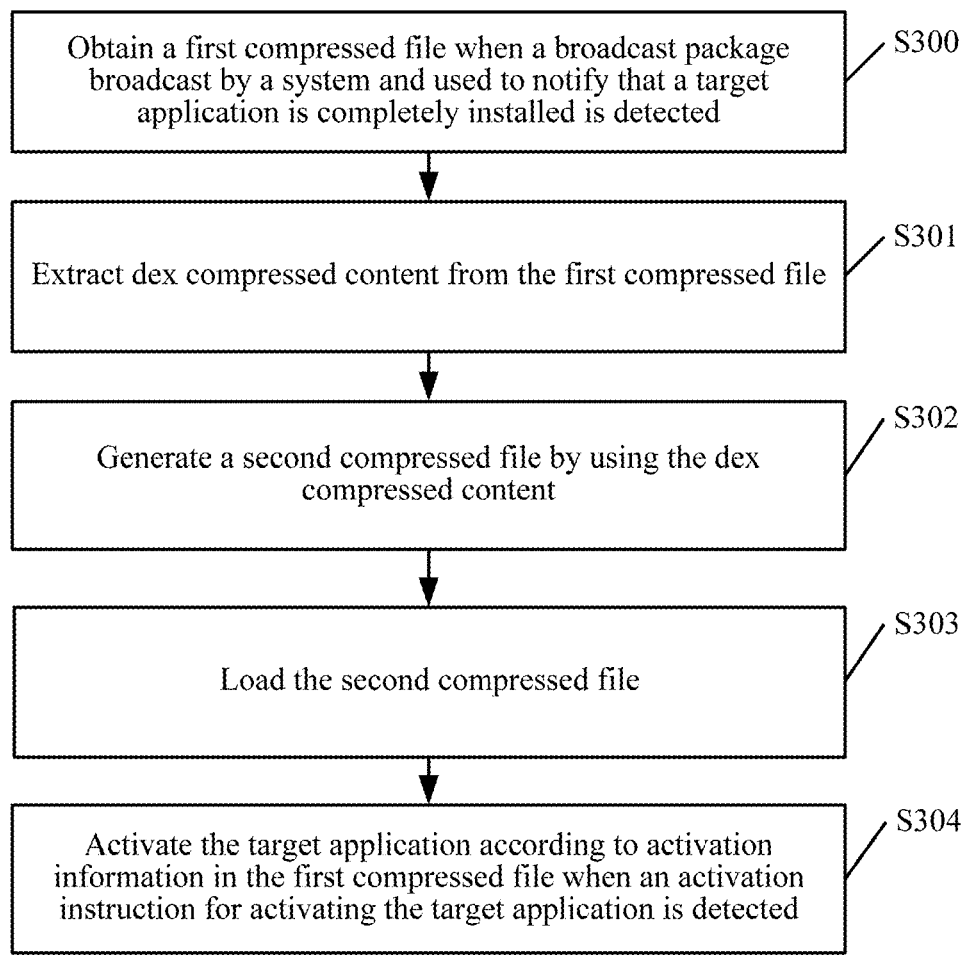
FIG. 3 is a flowchart of another application activation method according to an embodiment of the present disclosure.

FIG. 3 is a flowchart of another application activation method according to an embodiment of the present disclosure. Referring to FIG. 3, the method may include the following steps S300 to S304.

S300: Obtaining a first compressed file when a broadcast package broadcasted by a system and used to notify that a target application is completely installed is detected.

In one embodiment, after the target application is covered and installed, the system may broadcast a broadcast package PACKAGE_REPLACED used to notify that the target application is completely installed. The target application receives PACKAGE_REPLACED broadcast, and activates an independent process to pre-decompress the dex, that is, automatically obtains the first compressed file, and extracts the compressed dex content in the first compressed file. The compressed dex content is used to generate the second compressed file again, and the dex in the second compressed file is loaded.

Figure 5:
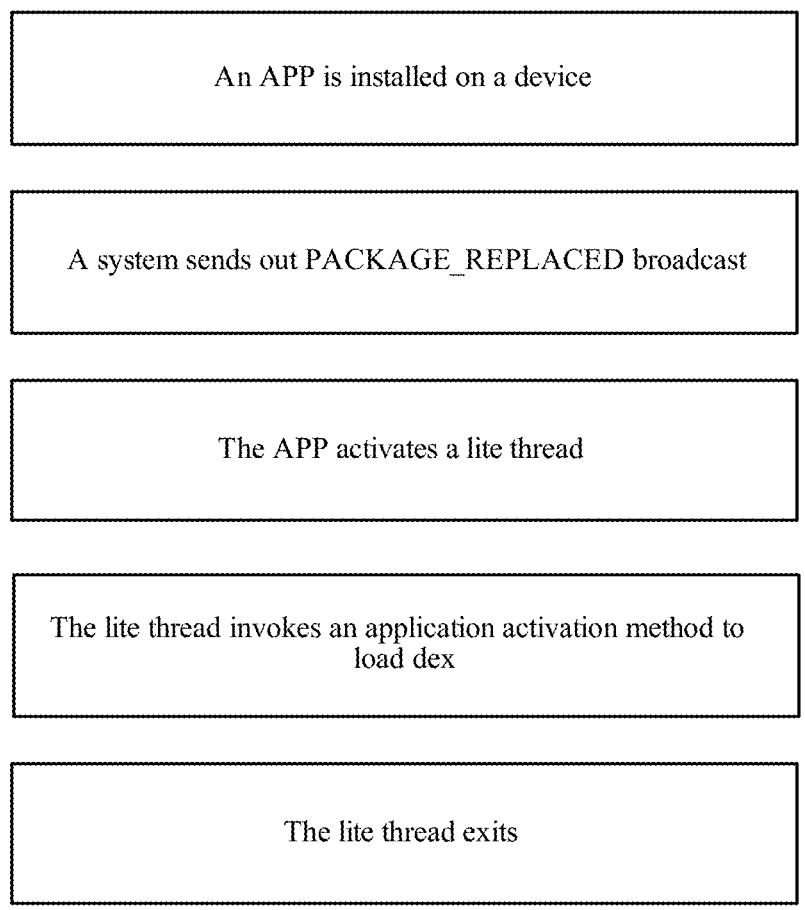
FIG. 5 is a flowchart of loading in a background according to an embodiment of the present disclosure.

As shown in FIG. 5, the APP is installed on a device. The system sends out the PACKAGE_REPLACED broadcast. The APP activates a lite thread. The lite thread invokes the application activation method in the embodiment in FIG. 2 of the present disclosure to load the dex. After the loading completes, the lite thread exits, and then the user uses the APP to directly shorten time for the first activation according to a non-first-time activation process.

S301: Extracting compressed dex content from the first compressed file.

S302: Generating a second compressed file by using the compressed dex content.

S303: Loading the second compressed file.

In one embodiment, reference may be made to steps S201 to S203 in the embodiment of FIG. 2 for steps S301 to S303, and details are not described herein again.

S304: Activating the target application according to activation information in the first compressed file when an activation instruction for activating the target application is detected.

In one embodiment, the target application is activated according to the activation information in the first compressed file when the activation instruction for activating the target application is detected (for example, the user clicks an application icon), without loading the dex again because the dex is loaded after the target application is installed.

Accordingly, in the embodiments of the present disclosure, the first compressed file is obtained, the first compressed file including the activation information of the target application and the compressed dex content of the target application; the compressed dex content is extracted from the first compressed file; the second compressed file is generated by using the compressed dex content; the compressed dex content in the second compressed file is loaded; and the target application is activated according to the activation information in the first compressed file when the activation instruction for activating the target application is detected. This may save time for decompressing and recompressing a dex package, reduce time for activating the target application, and improve user experience.

An application activation apparatus provided in the embodiments of the present disclosure is described below in detail with reference to FIG. 9 to FIG. 11.

Figure 9:
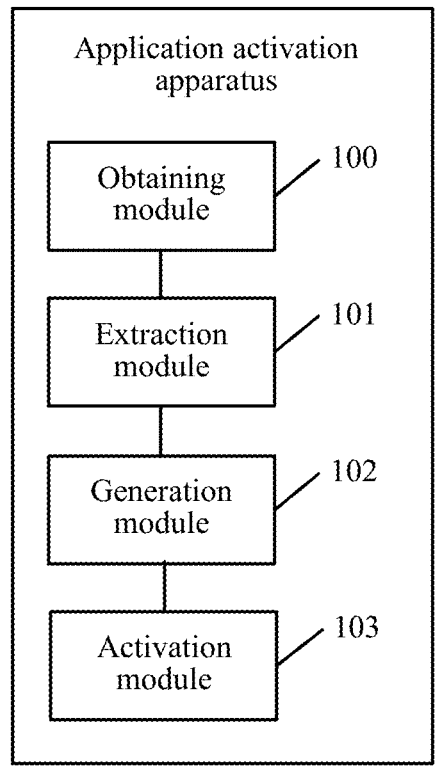
FIG. 9 is a schematic structural diagram of an application activation apparatus according to an embodiment of the present disclosure.

FIG. 9 is a schematic structural diagram of an application activation apparatus according to an embodiment. As shown in FIG. 9, the application activation apparatus includes an obtaining module 100, an extraction module 101, a generation module 102, and an activation module 103.

The obtaining module 100 is configured to obtain a first compressed file, the first compressed file including activation information of a target application and compressed content of a code package (also referred to as compressed dex content) of the target application.

In one embodiment, after the target application is installed, and when the target application is activated for the first time, a dexopt operation needs to be performed on the code package (i.e., a dex) to extract the dex from an APK file for loading.

Optionally, the first compressed file may be an installation package file, for example, an APK file. The APK file includes compressed dex content of the code package of the target application. The dex needs to be loaded during activation of the target application, and the dex is usually loaded in a form of zip file.

Further optionally, the first compressed file further includes the activation information of the target application. The activation information of the target application includes data for activating the target application and entry program code for activating the target application.

The extraction module 101 is configured to extract the compressed dex content from the first compressed file.

In one embodiment, the extraction module 101 extracts the compressed dex content from the first compressed file. A specific extraction process may be searching according to a file name of the compressed dex content. In an optional example, in an entry having a file name of classes2.dex in the APK file, the compressed dex content is found by traversing all entries, and details are shown in the following.

(1) An end-of-directory indication structure (the identifier is 0x06054b50) is first searched in the APK file and, at a position shifting downward for 16 bytes from the end-of-directory indication structure, the offset (the identifier is 0x02014b50) of a first entry of a core directory can be found.

(2) Subsequently, using a "for" loop to record information of each entry (offset of each entry in the APK file may be recorded, so as to position at the start point of the entry when the information is being written (that is, generating the second compressed file)), and file header information of the entry is found at a position 42-byte downward from the entry header. The file header information includes a file header and metadata (compressed data) of the file. Optionally, the file header information may further include hasDD. In the APK file, the compressed dex content is in the entry having the file name of classes2.dex. A write process of a zip compressed file may begin after the compressed dex content is found (for example, the zip compressed file may be manually written).

The generation module 102 is configured to generate the second compressed file by using the compressed dex content.

In one embodiment, the generation module 102 generates the second compressed file according to the extracted compressed dex content. A compression format of the second compressed file may be different from that of the first compressed file, for example, the compression format of the second compressed file may be a zip format. Here, the compressed dex content does not need to be first decompressed to a temporary directory and then be recompressed, thereby saving time for activating the target application.

Figure 10:
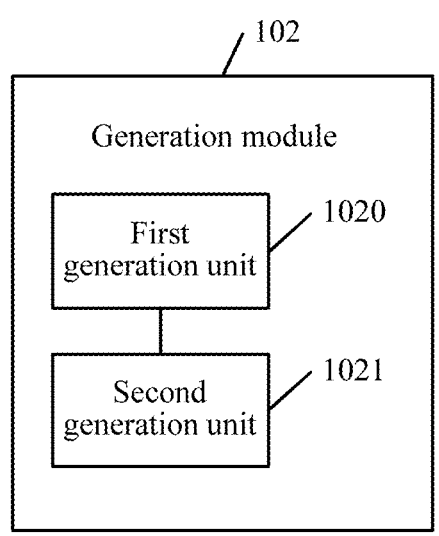
FIG. 10 is a schematic structural diagram of a generation module according to an embodiment of the present disclosure.

Optionally, as shown in FIG. 10, the generation module 102 may include a first generation unit 1020 and a second generation unit 1021.

The first generation unit 1020 is configured to generate header information of the second compressed file according to file header information of the compressed dex content in the first compressed file.

The second generation unit 1021 is configured to generate core directory information of the second compressed file according to core directory information of the compressed dex content in the first compressed file.

In one embodiment, the second compressed file includes header information, core directory information, and information of the end-of-directory indication structure. The header information of the second compressed file is generated according to the file header information corresponding to the compressed dex content in the first compressed file during generation of the second compressed file. The header information of the second compressed file may include a file header and metadata (compressed data) of the file. Optionally, the header information of the second compressed file may further include hasDD.

Further, during generation of the core directory information in the second compressed file, the core directory information in the second compressed file may alternatively be generated according to the core directory information of the compressed dex content in the first compressed file.

Specifically, the process of generating the second compressed file includes the following steps after the above (1) and (2).

(3) First, writing file header information of the second compressed file, where the file name needs to be changed as classes.dex, the file name length is again calculated, and other information can be copied from the file header information of the entry in the APK file classes2.dex.

(4) Subsequently writing core directory information of the entry of the second compressed file.

Because there is only one entry, the file name, file name length, and file header displacement of the entry can be correspondingly modified quickly, and other information can be directly copied from information in the entry in the original APK file classes2.dex. In the foregoing step (2), the offset position of the entry in the APK file is recorded during reading of the APK file. Thus, a buffer stream may be used when searching the classes2.dex. Because the number of information bytes of each field in the entry is determined, the offset status of all positions may be positioned and recorded by using one variable.

(5) Writing the information of the end-of-directory indication structure of the second compressed file.

The activation module 103 is configured to: load the second compressed file, and activate the target application according to the activation information in the first compressed file.

In one embodiment, the activation module 103 may load the compressed dex content in the second compressed file, and activate the target application according to the activation information in the first compressed file after the second compressed file is generated according to the compressed dex content. It should be noted that the activation information in the first compressed file may be in a decompressed state, for example, may be decompressed while being compiled during a process of installing the target application.

Figure 4:
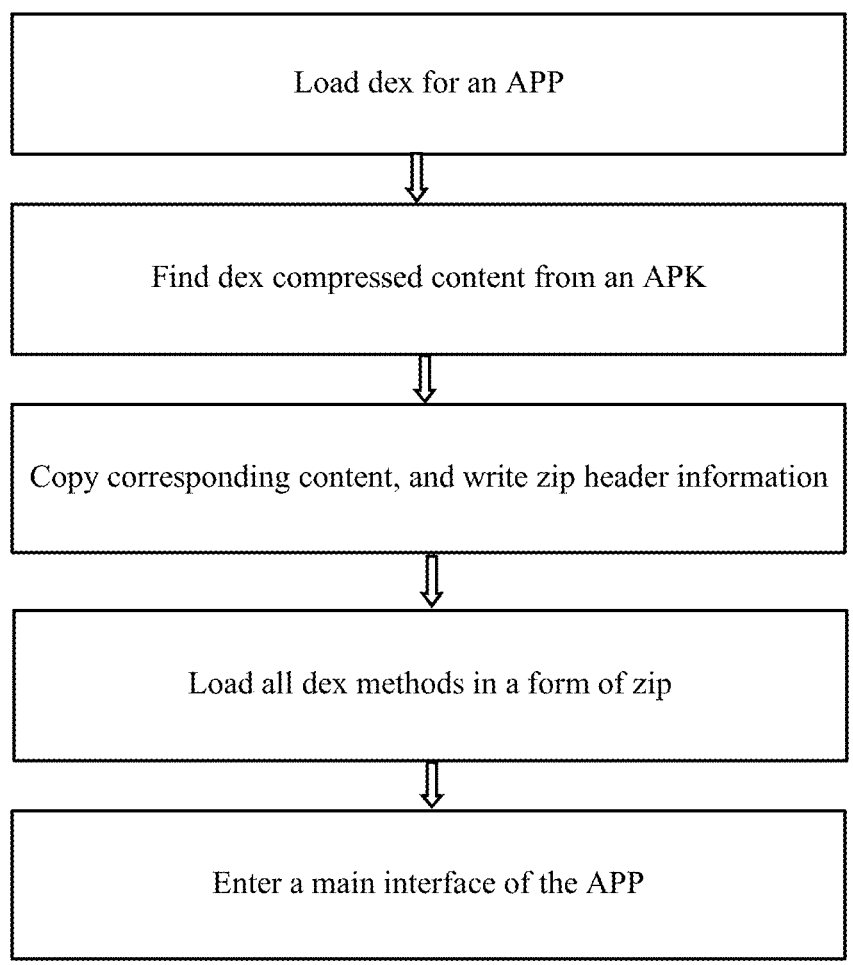
FIG. 4 is a flowchart of optimizing a dex decompression speed according to an embodiment of the present disclosure.

Reference may be made to the flowchart in FIG. 4 to understand how to optimize a dex decompression speed in the present disclosure. A dexopt operation needs to be performed on the dex when the installed target application is activated for the first time, and the dex needs to be extracted from the APK file. In this solution, the APK file is directly read; compressed dex content in a compressed state is found in the APK file; the corresponding content is copied and is directly outputted as a new zip file by means of adding a zip file header; all methods of the dex are loaded in the form of zip file; and finally, a main interface of an APP is entered. The decompression operation and then the compression operation are avoided as compared with conventional solutions. If the target application is activated by using a dual core mobile phone of 1 GHz, this operation time of the file may be reduced from seconds to milliseconds.

Optionally, the compressed dex content is a sub-dex package (also referred to as a code sub-package) in the first compressed file; the sub-dex package includes a non-activation entry program; the activation information includes a main dex package (also referred to as a code main-package) in the first compressed file; and the main dex package includes at least one activation entry program in the decompressed state.

Figure 11:
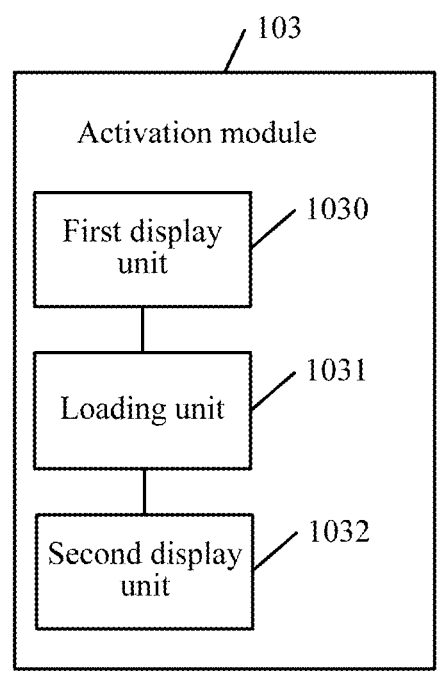
FIG. 11 is a schematic structural diagram of an activation module according to an embodiment of the present disclosure.

As shown in FIG. 11, the activation module 103 may include a first display unit 1030, a loading unit 1031, and a second display unit 1032.

The first display unit 1030 is configured to: activate the main dex package, and display an activation interface.

The loading unit 1031 is configured to load the second compressed file.

The second display unit 1032 is configured to: execute the at least one activation entry program in the main dex package, and display a main interface of the target application when it is detected that the second compressed file is completely loaded.

In the conventional technology, when the target application is installed and activated for the first time, if the user clicks an application icon to activate the target application, the dex is first loaded and, after the loading of the dex is completed, the activation entry program of the target application is invoked to activate the target application, at which point a screen change or screen flicker finally occurs. That is, by activating the target application in this way, the user cannot see the screen change during a process of loading the dex, appearing in a frame freezing state occurs and resulting in poor user experience.

In one embodiment, the foregoing activation process is also improved, such that the screen change occurs first and then the dex is loaded. However, to implement the foregoing activation process, all direct dependency sets and indirect dependency sets of all possible activation entry programs need to be allocated in the main dex package during the installation and the compiling. In this way, the activation interface may be invoked during activation of the main dex package, that is, the screen change occurs. As shown in FIG. 6, when the user clicks the application icon, a second activation interface occurs, and the dexes are asynchronously loaded during a process of displaying the activation interface.

It should be noted that the dependency sets in the main dex package are very large, and an automatic sub-package solution of the system cannot ensure that the dependency sets of all activation entry programs are in the main dex package. Therefore, all direct dependency sets and indirect dependency sets of the activation entry programs may be analyzed, and then the dependency sets are ensured to be in the main dex package. In this way, successful activation is ensured. A script of the sub-dex package may be modified. A preset classification rule is added, and all programs are allocated in the main dex package and the sub-dex package according to the preset classification rule during the process of installing and compiling the target application.

A smallest dependency set needs to be kept in the main dex package, so as to ensure that the main dex package can have all dependency sets of us, mainly including the following parts: service, content provider, broadcast, MusicApplication, LifeCycleManager, BaseActivity, OuterShellBaseActivity, and DexActivity.

Preferably, outer shell activities (the OuterShellBaseActivity and the DexActivity) are added to the main dex package. The OuterShellBaseActivity is in a base type, similar to the Activity. When the target application is activated for the first time, if the compressed dex content in the sub-dex package is not loaded, the activation interface may be invoked and displayed by using the outer shell. The flow is shown in FIG. 8:

A. A corresponding activity is activated by using a normal entry, and whether the dex is loaded is first determined in a base component Activity or an outer shell component OuterShellBaseActivity.

If yes->the activity is normally activated, and step B is performed; and

If not->current intent information is remained and is saved in a next intent, and then the DexActivity is activated. An original activity is activated according to the obtained intent after the dex is loaded in the DexActivity. The screen changing state is maintained during the process of asynchronously loading the dex. When the dex is completely loaded, the application is activated by invoking an application activation component, and a main interface of the application occurs. This activation manner is first-time activation logic.

B. The dex is loaded in onattachbasecontext, and then the application is activated by invoking the application activation component, where a screen change occurs. This activation manner is non-first-time activation logic.

Further, as shown in FIG. 8, the activation manner may be an activation manner of covering and installing. Details are described in the embodiment of FIG. 3, and are not described herein again.

As shown in the table of FIG. 7, activating the target application consumes different time by using different solutions. For example, if the target application is activated by using a dual core P1 mobile phone of 1 GHz of android 4.4.2, 3100 ms is consumed when the target application is activated by using a conventional solution, while 170 ms is consumed after being optimized by using the present disclosure. If the target application is activated by using a dual core P2 mobile phone of 1 GHz of android 4.4.4, 1400 ms is consumed when the target application is activated by using the conventional solution, while 170 ms is consumed after being optimized by using the present disclosure. It may be learned from the above comparison that time for activating the target application for the first time may be significantly reduced by using the application activation methods.

Preferably, the obtaining module 100 is specifically configured to obtain the first compressed file when a broadcast package broadcasted by the system and used to notify that the target application is completely installed is detected.

In one embodiment, after the target application is covered and installed, the system may broadcast a broadcast package PACKAGE_REPLACED used to notify that the target application is completely installed. The target application obtaining module 100 receives PACKAGE_REPLACED broadcast, and activates an independent process to pre-decompress the dex, that is, automatically obtains the first compressed file, and extracts the compressed dex content in the first compressed file. The compressed dex content is used to generate the second compressed file again, and the dex in the second compressed file is loaded.

As shown in FIG. 5, the APP is installed on a device. The system sends out the PACKAGE_REPLACED broadcast. The APP activates a lite thread. The lite thread invokes the application activation method in the embodiment in FIG. 2 of the present disclosure to load the dex. After the loading completes, the lite thread exits, and then the user uses the APP to directly shorten time for the first activation according to a non-first-time activation process.

The activation module 103 activating the target application according to the activation information in the first compressed file specifically includes: activating the target application according to the activation information in the first compressed file when an activation instruction for activating the target application is detected.

In one embodiment, the activation module 103 activates the target application according to the activation information in the first compressed file when the activation instruction for activating the target application is detected (for example, the user clicks the application icon), without loading the dex again because the dex is loaded after the target application is installed.

Accordingly, in the embodiments of the present disclosure, the first compressed file is obtained, the first compressed file including the activation information of the target application and the compressed dex content of the target application; the compressed dex content is extracted from the first compressed file; the second compressed file is generated by using the compressed dex content; the compressed dex content in the second compressed file is loaded; and the target application is activated according to the activation information in the first compressed file when the activation instruction for activating the target application is detected.

This may save time for decompressing and recompressing a dex package, reduce time for activating the target application, and improve user experience.

A person of ordinary skill in the art may understand that all or a part of the method in the foregoing embodiments may be implemented by computer program instructing relevant hardware. The program may be stored in a computer readable storage medium. A program corresponding to the application activation apparatus shown in FIG. 9 to FIG. 11 may be stored in a readable storage medium of the application activation apparatus, and is executed by at least one processor in the application activation apparatus, to implement the foregoing application activation methods. The storage medium may be a magnetic disc, an optical disc, a read-only memory (ROM), or a random-access memory (RAM).

What is disclosed above is merely exemplary embodiments of the present disclosure, and certainly is not intended to limit the scope of the present disclosure. Therefore, equivalent variations made in accordance with the claims of the present disclosure shall fall within the scope of the present disclosure.

What is claimed is:

1. An application activation method, comprising:
obtaining a first compressed file, the first compressed file containing activation information of an application and compressed content of a code package of the application, the activation information comprising a code main-package, and the main- package comprising at least one activation entry program in a decompressed state;
extracting the compressed content from the first compressed file, the compressed content being a code sub-package in the first compressed file;
generating a second compressed file by using the compressed content without decompressing the compressed content;
activating the main-package and displaying an activation interface that changes a current screen;
loading the second compressed file asynchronously after displaying the activation interface; and
activating the application according to the activation information in the first compressed file, including: executing the at least one activation entry program in the main-package, and displaying a main interface of the application upon detecting that the second compressed file is completely loaded;
wherein the sub-package comprises a non-activation entry program; and the non-activation entry program allocated in the sub-package in the first compressed file and the activation entry program allocated in the main-package in the first compressed file are obtained according to a preset classification rule during installation and compiling of the application.

2. The method according to claim 1, wherein the first compressed file is an Android package (APK) file, and the second compressed file is a zip compressed file.

3. The method according to claim 2, wherein the generating a second compressed file by using the compressed content comprises:
copying the compressed content; and
writing zip header information into the copied compressed content.

4. The method according to claim 1, wherein the generating a second compressed file by using the compressed content comprises:
generating header information of the second compressed file according to file header information of the compressed content in the first compressed file; and
generating core directory information of the second compressed file according to core directory information of the compressed content in the first compressed file.

5. The method according to claim 1, wherein the obtaining a first compressed file comprises:
obtaining the first compressed file when a broadcast package broadcasted by a system and used to notify that the application is completely installed is detected.

6. The method according to claim 1, wherein the activating the application according to the activation information in the first compressed file comprises:
activating the application according to the activation information in the first compressed file when an activation instruction for activating the application is detected.

7. The method according to claim 1, wherein the activation interface is invoked upon detecting that the application is installed and activated for the first time.

8. The method according to claim 7, wherein the main-package includes an outer shell component, and the method further comprises:
when a normal entry of the application is detected, determining whether the normal entry is a first time activation; and
invoking the activation interface by using the outer shell component.

9. A non-transitory computer-readable storage medium storing computer program instructions executable by at least one processor to perform:
obtaining a first compressed file, the first compressed file containing activation information of an application and compressed content of a code package of the application, the activation information comprising a code main-package, and the main- package comprising at least one activation entry program in a decompressed state;
extracting the compressed content from the first compressed file, the compressed content being a code sub-package in the first compressed file;
generating a second compressed file by using the compressed content without decompressing the compressed content;
activating the main-package and displaying an activation interface that changes a current screen;
loading the second compressed file asynchronously after displaying the activation interface; and activating the application according to the activation information in the first compressed file, including: executing the at least one activation entry program in the main-package, and displaying a main interface of the application upon detecting that the second compressed file is completely loaded;
wherein the sub-package comprises a non-activation entry program; and the non-activation entry program allocated in the sub-package in the first compressed file and the activation entry program allocated in the main-package in the first compressed file are obtained according to a preset classification rule during installation and compiling of the application.

10. The non-transitory computer-readable storage medium according to claim 9, wherein the first compressed file is an Android package (APK) file, and the second compressed file is a zip compressed file.

11. The method according to claim 10, wherein the generating a second compressed file by using the compressed content comprises:
copying the compressed content; and writing zip header information into the copied compressed content.

12. The non-transitory computer-readable storage medium according to claim 9, wherein the generating a second compressed file by using the compressed content comprises:
   generating header information of the second compressed file according to file header information of the compressed content in the first compressed file; and
   generating core directory information of the second compressed file according to core directory information of the compressed content in the first compressed file.

13. The non-transitory computer-readable storage medium according to claim 9, wherein the obtaining a first compressed file comprises:
   obtaining the first compressed file when a broadcast package broadcasted by a system and used to notify that the application is completely installed is detected.

14. The non-transitory computer-readable storage medium according to claim 9, wherein the activating the application according to the activation information in the first compressed file comprises:
   activating the application according to the activation information in the first compressed file when an activation instruction for activating the application is detected.

15. An application activation apparatus, comprising:
   a memory; and
   a processor coupled to the memory and configured to perform:
      obtaining a first compressed file, the first compressed file containing activation information of an application and compressed content of a code package of the application, the activation information comprising a code main-package, and the main-package comprising at least one activation entry program in a decompressed state;
      extracting the compressed content from the first compressed file, the compressed content being a code sub-package in the first compressed file;
      generating a second compressed file by using the compressed content without decompressing the compressed content;
      activating the main-package and displaying an activation interface that changes a current screen;
      loading the second compressed file asynchronously after displaying the activation interface; and
      activating the application according to the activation information in the first compressed file, including:
         executing the at least one activation entry program in the main-package, and displaying a main interface of the application upon detecting that the second compressed file is completely loaded;
      wherein the sub-package comprises a non-activation entry program; and the non-activation entry program allocated in the sub-package in the first compressed file and the activation entry program allocated in the main-package in the first compressed file are obtained according to a preset classification rule during installation and compiling of the application.

16. The apparatus according to claim 15, wherein the first compressed file is an Android package (APK) file, and the second compressed file is a zip compressed file.

* * * * *